(12) United States Patent
Hsu et al.

(10) Patent No.: US 11,652,476 B2
(45) Date of Patent: May 16, 2023

(54) PAD-TRACKING CIRCUIT DESIGN TO PREVENT LEAKAGE CURRENT DURING POWER RAMP UP OR RAMP DOWN OF OUTPUT BUFFER

(71) Applicant: MEDIATEK INC., Hsin-Chu (TW)

(72) Inventors: Hsin-Cheng Hsu, Hsinchu (TW); Chien Wu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/499,886

(22) Filed: Oct. 13, 2021

(65) Prior Publication Data

US 2022/0239290 A1   Jul. 28, 2022

Related U.S. Application Data

(60) Provisional application No. 63/142,517, filed on Jan. 28, 2021.

(51) Int. Cl.
*H03K 19/00* (2006.01)
*H03K 17/16* (2006.01)
*H03K 4/06* (2006.01)
*H03K 19/007* (2006.01)

(52) U.S. Cl.
CPC .............. *H03K 17/16* (2013.01); *H03K 4/06* (2013.01); *H03K 19/007* (2013.01)

(58) Field of Classification Search
CPC ........ H03K 17/16; H03K 4/06; H03K 19/007; H03K 19/018507; H03K 19/00315
See application file for complete search history.

(56) References Cited

U.S. PATENT DOCUMENTS

| | | | |
|---|---|---|---|
| 5,966,026 A | 10/1999 | Partovi | |
| 6,184,700 B1* | 2/2001 | Morris | H03K 19/00315 326/14 |
| 6,696,867 B2 | 2/2004 | Keeth et al. | |
| 6,970,024 B1* | 11/2005 | Reese | H03K 19/00315 327/112 |
| 7,633,321 B2* | 12/2009 | Hebenstreit | H03K 19/018521 327/108 |
| 7,834,653 B1 | 11/2010 | Kumar | |
| 7,986,171 B2* | 7/2011 | Wang | H03K 19/0013 327/108 |

(Continued)

FOREIGN PATENT DOCUMENTS

TW    I406500 B1    8/2013

*Primary Examiner* — Tuan T Lam
(74) *Attorney, Agent, or Firm* — Winston Hsu

(57) ABSTRACT

The present invention provides an output buffer including a first transistor, a second transistor and a pad-tracking circuit is disclosed. The first transistor is coupled between a supply voltage and an output node, wherein the output node is coupled to a pad. The second transistor is coupled between the output node and a reference voltage. The pad-tracking circuit is coupled to the control circuit and the first transistor, and is configured to generate a gate control signal to a gate electrode of the first transistor. The output buffer is selectively operated in an input mode and a fail-safe mode, and when the output buffer switches between the input mode and the fail-safe mode and the supply voltage of the first transistor ramps up or ramps down, the pad-tracking circuit generates the gate control signal to the gate electrode of the first transistor according to the voltage of the pad.

12 Claims, 9 Drawing Sheets

(56) References Cited

U.S. PATENT DOCUMENTS

| | | | |
|---|---|---|---|
| 8,598,941 B2 | 12/2013 | Bhattacharya et al. | |
| 9,432,005 B2* | 8/2016 | Tsai | H03K 19/017509 |
| 9,738,738 B2* | 8/2017 | Abell | C08K 3/36 |
| 10,644,701 B1* | 5/2020 | Su | H03K 19/007 |
| 10,673,436 B1* | 6/2020 | Hegde | H03K 19/17788 |
| 10,985,754 B1* | 4/2021 | Lee | H03K 19/018592 |
| 2008/0068050 A1* | 3/2008 | Ajit | G11C 5/14 |
| | | | 327/108 |
| 2010/0253392 A1* | 10/2010 | Ker | H03K 19/018592 |
| | | | 327/108 |
| 2019/0305778 A1 | 10/2019 | Chen | |
| 2020/0145002 A1* | 5/2020 | Srinivasan | H03K 19/018521 |
| 2021/0208615 A1* | 7/2021 | Bogi | H03K 19/007 |

* cited by examiner

PAD-TRACKING CIRCUIT DESIGN TO PREVENT LEAKAGE CURRENT DURING POWER RAMP UP OR RAMP DOWN OF OUTPUT BUFFER

CROSS REFERENCE TO RELATED APPLICATIONS

This application claims the priority of U.S. Provisional Application No. 63/142,517, filed on Jan. 28, 2021, which is included herein by reference in its entirety.

BACKGROUND

In conventional general purpose input/output (GPIO) designs, an output buffer and an input buffer are connected to the same pad, and the GPIO can be operate in an output mode, an input mode or a fail-safe mode. Regarding three modes of the GPIO, when the GPIO operates in the output mode, the output buffer is enabled so that a signal can be outputted to another device via the pad; when the GPIO operates in the input mode, the output buffer is disabled; and when the GPIO operates in the fail-safe mode, the output buffer is disabled while no supply voltage is applied to the output buffer, and a high voltage is provided to the pad. In the above design, however, the output buffer may have leakage current if the supply voltage ramps up or ramp down, that is the output buffer may have leakage when a switching operation between the input mode and the fail-safe mode.

SUMMARY

It is therefore an objective of the present invention to provide an output buffer design, which can prevent leakage current during power ramp up and power ramp down of the output buffer, to solve the above-mentioned problems.

According to one embodiment of the present invention, an output buffer comprising a first transistor, a second transistor and a pad-tracking circuit is disclosed. The first transistor is coupled between a supply voltage and an output node, wherein the output node is coupled to a pad. The second transistor is coupled between the output node and a reference voltage. The pad-tracking circuit is coupled to the control circuit and the first transistor, and is configured to generate a gate control signal to a gate electrode of the first transistor. The output buffer is selectively operated in an input mode and a fail-safe mode, when the output buffer operates in the input mode, the pad-tracking circuit generates the gate control signal to disable the first transistor, and the second transistor is also disabled; and when the output buffer operates in the fail-safe mode, the first transistor is powered down, and the pad-tracking circuit generates the gate control signal to the gate electrode of the first transistor according to a voltage of the pad. When the output buffer switches between the input mode and the fail-safe mode and the supply voltage of the first transistor ramps up or ramps down, the pad-tracking circuit generates the gate control signal to the gate electrode of the first transistor according to the voltage of the pad.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
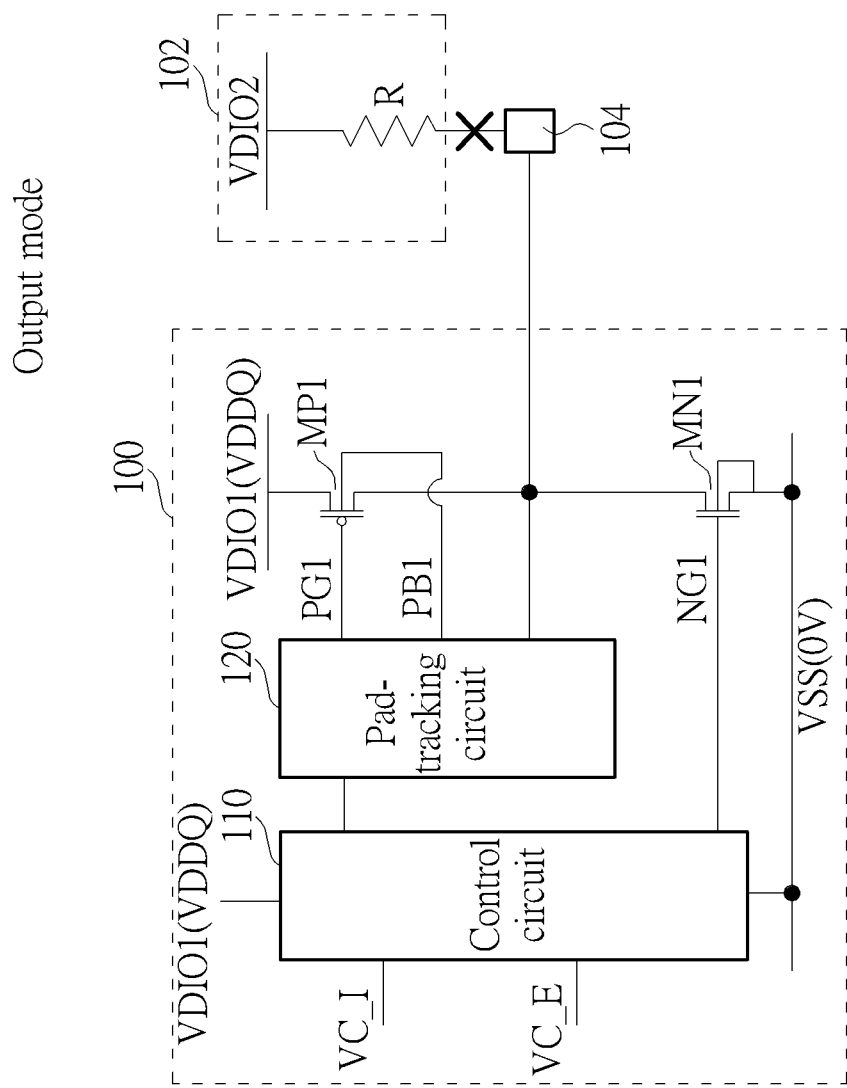
FIG. 1 is a diagram illustrating an output buffer operating in an output mode according to one embodiment of the present invention.

FIG. 1 is a diagram illustrating an output buffer 100 operating in an output mode according to one embodiment of the present invention. As shown in FIG. 1, the output buffer 100 comprises a control circuit 110, a pad-tracking circuit 120, a P-type transistor MP1 and an N-type transistor MN1, wherein the output buffer 100 is supplied by a supply voltage VDIO1 and a reference voltage VSS, and the supply voltage VDIO1 may be equal to a fixed high voltage VDDQ, and the reference voltage VSS may be equal to 0V. In addition, the output buffer 100 is coupled to a pad 104, wherein the pad 104 is selectively coupled to a specific voltage provider 102, wherein the specific voltage provider 100 is configured to selectively provide a supply voltage VDIO2 to the pad 104 via a resistor R.

When the output buffer 100 operates in the output mode, the output buffer 100 is configured to output a high voltage (i.e., logical value "1") or a low voltage (i.e., logical value "0") to the pad 104, and the specific voltage provider 102 is disabled. Specifically, the control circuit 110 receives two control signals VC_I and VC_E, wherein the control signal VC_E is used to indicate if the output buffer 100 operates in the output mode, and the control signal VC_I is used to control the output buffer 100 to output the high voltage or the low voltage. In this embodiment, when the control signal VC_E is equal to "1", the control circuit 110 determines the output mode, and if the control signal VC_I is equal to "0", the control circuit 110 controls the pad-tracking circuit 120 to generate a gate control signal PG1 having high voltage such as VDDQ to a gate of the transistor MP1, and to generate a bulk control signal PB1 having high voltage such as VDDQ to a bulk of the transistor MP1, to disable transistor MP1; and the control circuit 110 further generates a gate control signal NG1 having high voltage such as VDDQ to a gate of the transistor MN1 to enable the transistor MN1. At this time, the pad 104 has a low voltage such as 0V. On the other hand, if the control signal VC_I is equal to "1", the control circuit 110 controls the pad-tracking circuit 120 to generate the gate control signal PG1 having low voltage such as 0V to the gate of the transistor MP1, and to generate the bulk control signal PB1 having high voltage such as VDDQ to the bulk of the transistor MP1, to enable transistor MP1; and the control circuit 110 further generates the gate control signal NG1 having low voltage such as 0V to the gate of the transistor MN1 to disable the transistor MN1. At this time, the pad 104 has a high voltage such as VDDQ.

Figure 2:
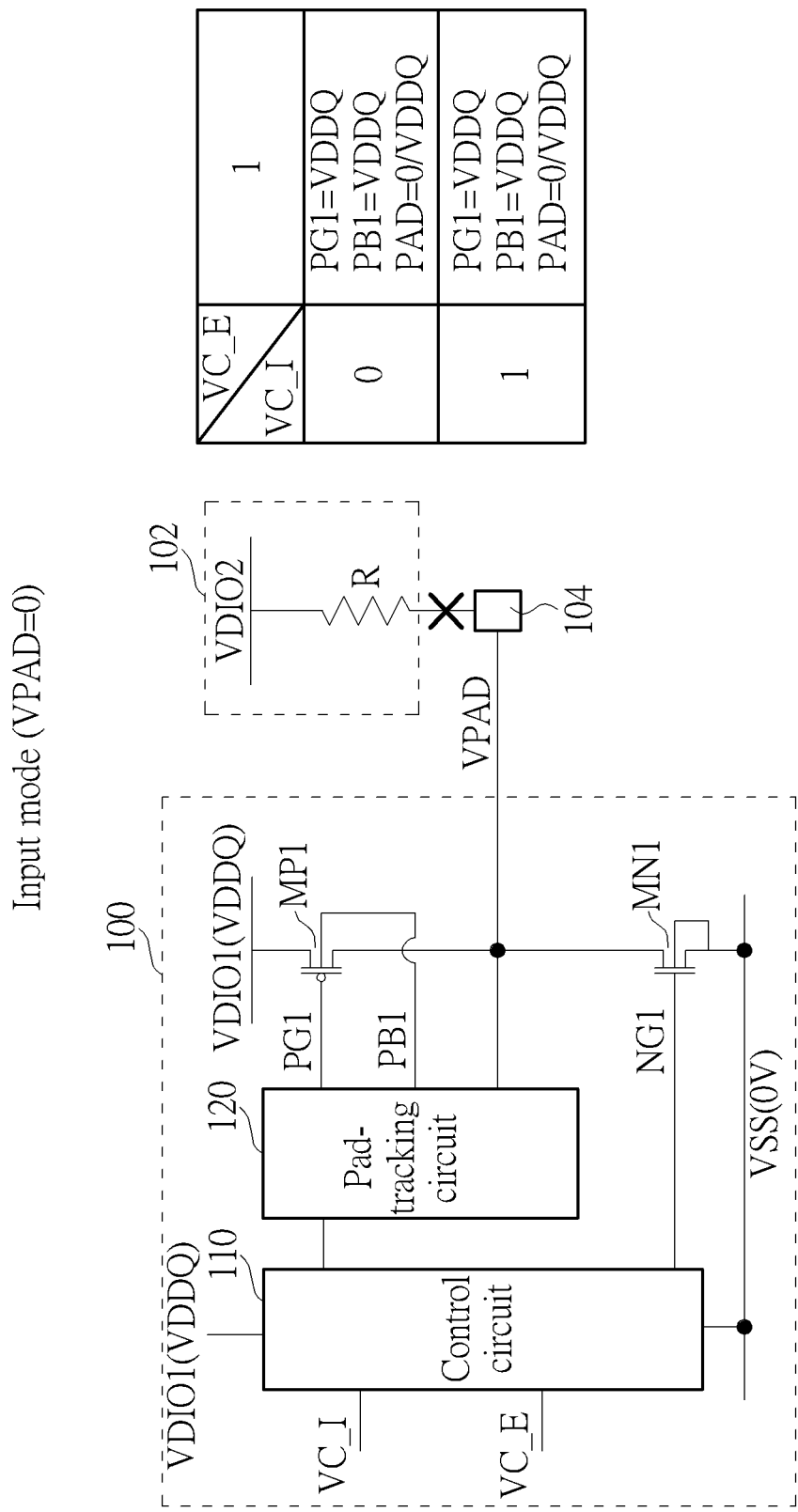
FIG. 2 is a diagram illustrating the output buffer operating in an input mode according to one embodiment of the present invention.

FIG. 2 is a diagram illustrating the output buffer 100 operating in an input mode according to one embodiment of the present invention. As shown in FIG. 2, when the output buffer 100 operates in the input mode, the output buffer 100 and the specific voltage provider 102 are disabled, and an input buffer (not shown) is configured to receive signal at the pad 104. Specifically, the control circuit 110 receives two control signals VC_I and VC_E, wherein the control signal VC_E is used to indicate if the output buffer 100 operates in the input mode. In this embodiment, when the control signal VC_E is equal to "0", the control circuit 110 determines the output mode, and under the condition that a voltage VPAD at the pad 104 has lower voltage level such as 0V, regardless of whether the control signal VC_I is equal to 0 or 1, the control circuit 110 controls the pad-tracking circuit 120 to generate the gate control signal PG1 having high voltage such as VDDQ to the gate of the transistor MP1, and to generate the bulk control signal PB1 having high voltage such as VDDQ to the bulk of the transistor MP1, to disable transistor MP1; and the control circuit 110 further generates the gate control signal NG1 having low voltage such as 0V to the gate of the transistor MN1 to disable the transistor MN1. At this time, the output buffer 100 does not provide any signal to the pad 104.

Figure 3:
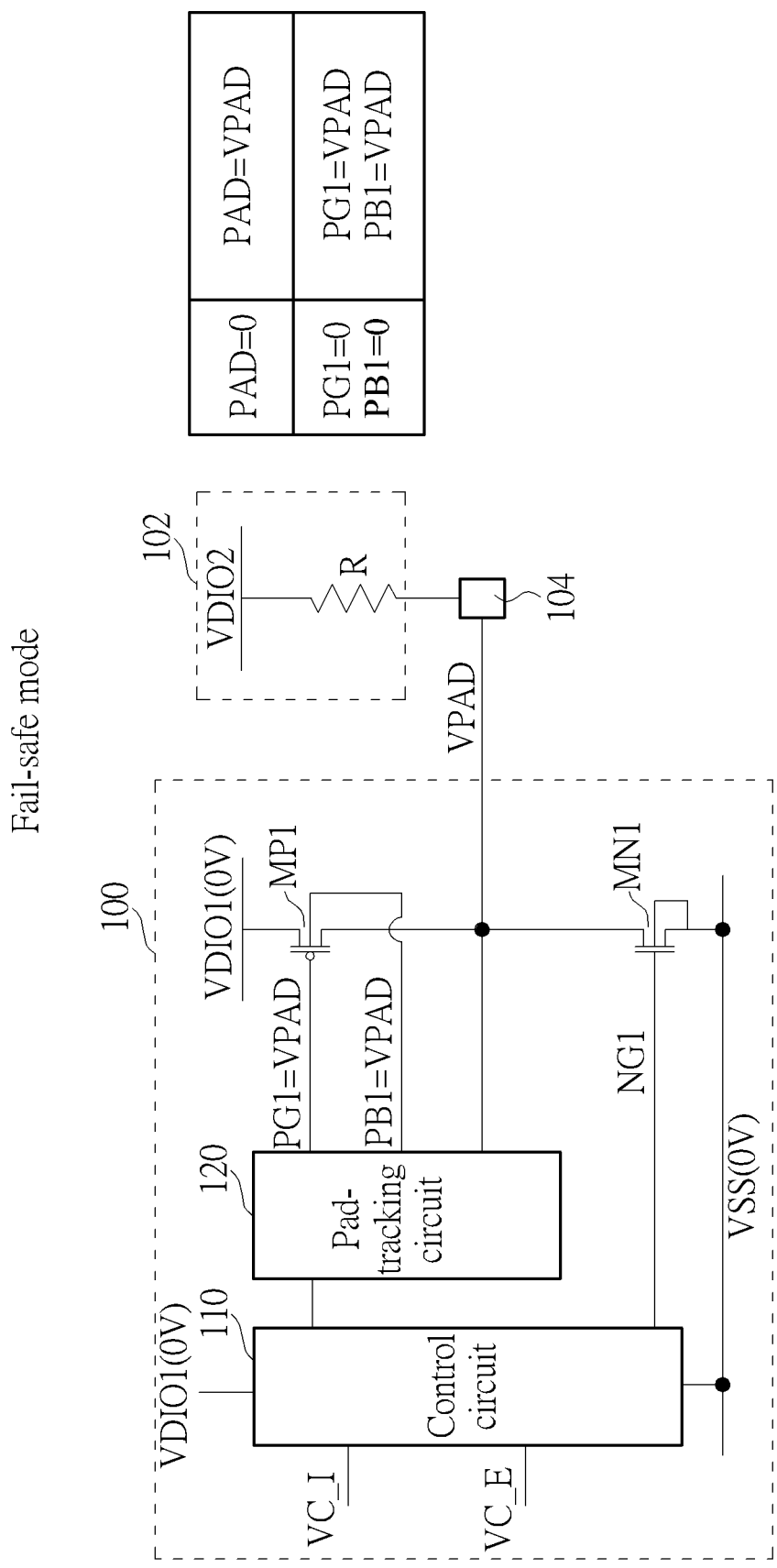
FIG. 3 is a diagram illustrating the output buffer operating in a fail-safe mode according to one embodiment of the present invention.

FIG. 3 is a diagram illustrating the output buffer 100 operating in a fail-safe mode according to one embodiment of the present invention. As shown in FIG. 3, when the output buffer 100 operates in the fail-safe mode, the control circuit 110 and the transistor MP1 of the output buffer 100 are powered down (i.e., the supply voltage VDIO1 becomes 0V), the specific voltage provider 102 is enabled to provide high voltage to the pad 104 (in this embodiment, the pad 104 has voltage VPAD which is much close to supply voltage VDIO2, and the supply voltage VDIO2 may be equal to or higher than VDDQ), and the pad-tracking circuit 120 can be supplied by the supply voltage VDIO2 to generate the gate control signal PG1 and the bulk control signal PB1 based on the voltage VPAD at the pad 104. Specifically, when the output buffer 100 operates in the fail-safe mode, the pad-tracking circuit 120 generates the gate control signal PG1 and the bulk control signal PB1 having the voltage VPAD to the transistor MP1, to disable the transistor MP1 to prevent leakage current. In addition, in this embodiment, VDDQ is provided by a voltage source, and VDDQ always has a high voltage level (fixed high voltage level) no matter if the output buffer 100 operates in the output mode and the input mode.

Figure 4:
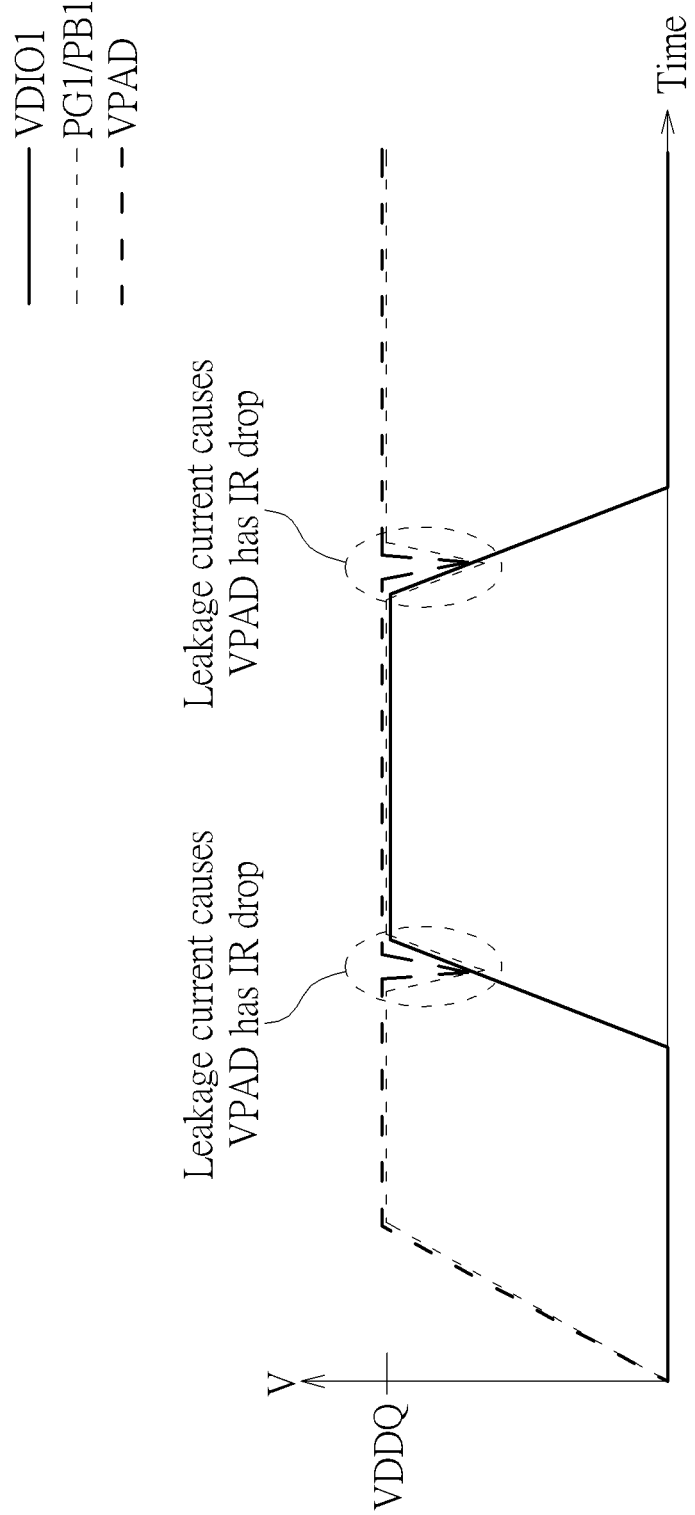
FIG. 4 shows a conventional output buffer that a voltage at the pad has an IR drop when switching between the input mode and the fail-safe mode.
Figure 5:
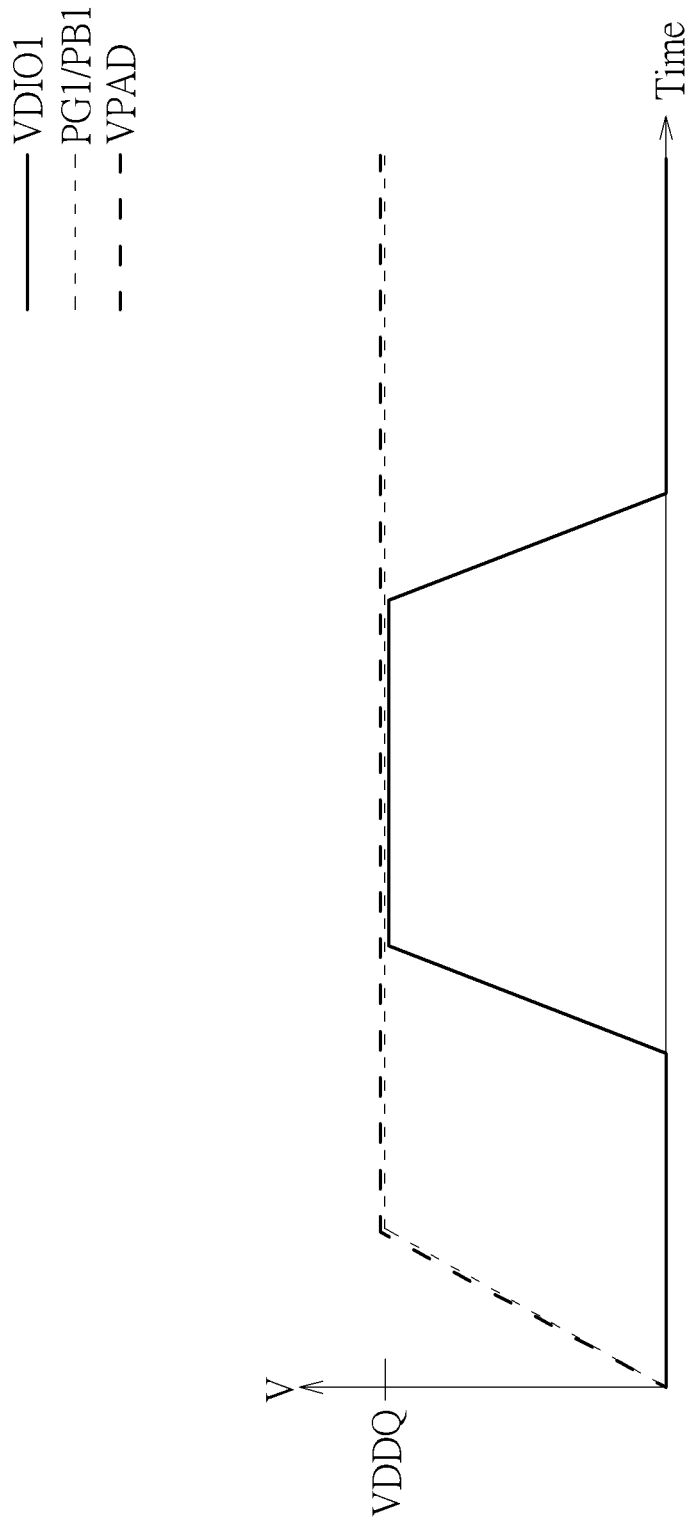
FIG. 5 shows that no leakage current occurs in the embodiment of the present invention.

In the conventional art, when the output buffer 100 operates in the input mode, the control circuit 110 always controls the pad-tracking circuit 120 to generate the gate control signal PG1 having VDDQ to disable the transistor MP1. However, when the output buffer 100 switches between the input mode and the fail-safe mode, that is the supply voltage VDIO1 increases from 0V to VDDQ or decreases from VDDQ to 0V, the transistor MP1 may be enabled within a period of time, thus causing leakage current. Specifically, referring to FIG. 4, when the supply voltage VDIO1 ramps up or ramps down, the gate control signal PG1 and the bulk control signal PB1 may be dropped and the transistor MP1 may be enabled so that a leakage current flowing from the pad 104 to the source electrode of the transistor MP1, causing the voltage VPAD has an IR drop. In order to solve this problem, the pad-tracking circuit 120 is configured to always provide the voltage VPAD at the pad 104 as the gate control signal PG1 and the bulk control signal PB1 when the supply voltage VDIO1 ramps up or ramps down, and there will be no leakage current between the pad 104 and the supply voltage VDIO1, as shown in FIG. 5.

Figure 6:
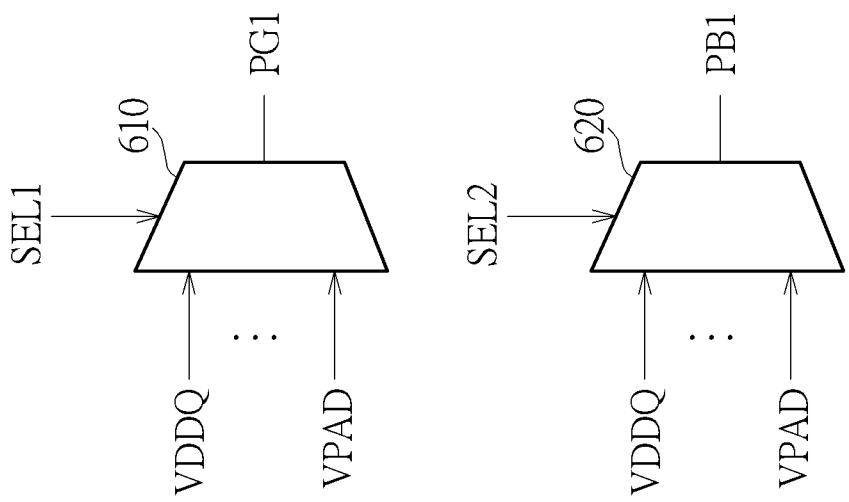
FIG. 6 is a diagram illustrating the pad-tracking circuit according to one embodiment of the present invention.

FIG. 6 is a diagram illustrating the pad-tracking circuit 120 according to one embodiment of the present invention. As shown in FIG. 6, the pad-tracking circuit 120 comprises a first multiplexer 610 and a second multiplexer 620, wherein the first multiplexer 610 is configured to receive a plurality of input signals such as VDDQ and VPAD, and select one of the input signals as the gate control signal PG1 according to a first selection signal SEL1; and the second multiplexer 620 is configured to receive a plurality of input signals such as VDDQ and VPAD, and select one of the input signals as the bulk control signal PB1 according to a second selection signal SEL2. In this embodiment, when the supply voltage VDIO1 is equal to 0V and the output buffer 100 operates in the fail-safe mode, the first multiplexer 610 outputs the voltage VPAD at the pad 104 as the gate control signal PG1, and the second multiplexer 620 outputs the voltage VPAD at the pad 104 as the bulk control signal PB1. That is, if VPAD is a low voltage such as 0V, the gate control signal PG1 and the bulk control signal PB1 are equal to 0V; and if VPAD is a high voltage such as VDIO2/VDDQ, the gate control signal PG1 and the bulk control signal PB1 are equal to VDDQ. In addition, when the supply voltage VDIO1 is equal to VDDQ and the output buffer 100 operates in the input mode, if VPAD is a low voltage such as 0V, the first multiplexer 610 outputs VDDQ at the pad 104 as the gate control signal PG1, and the second multiplexer 620 outputs VDDQ at the pad 104 as the bulk control signal PB1; and if VPAD is a high voltage such as VDIO2/VDDQ, the first multiplexer 610 outputs VPAD at the pad 104 as the gate control signal PG1, and the second multiplexer 620 outputs VPAD at the pad 104 as the bulk control signal PB1. In addition, in the input mode, the first selection signal SEL1 and the second selection signal SEL2 can be any signal capable of indicating the level of VPAD.

In the embodiment shown in FIG. 6, no matter what mode it is (input mode or fail-safe mode), when the pad 104 receives a high voltage such as VDIO2 from the specific voltage provider 102, the pad-tracking circuit 120 always provides the voltage VPAD at the pad 104 as the gate control signal PG1 and the bulk control signal PB1, to prevent the leakage current of the transistor MP1 when the supply voltage VDIO1 ramps up or ramps down.

Figure 7:
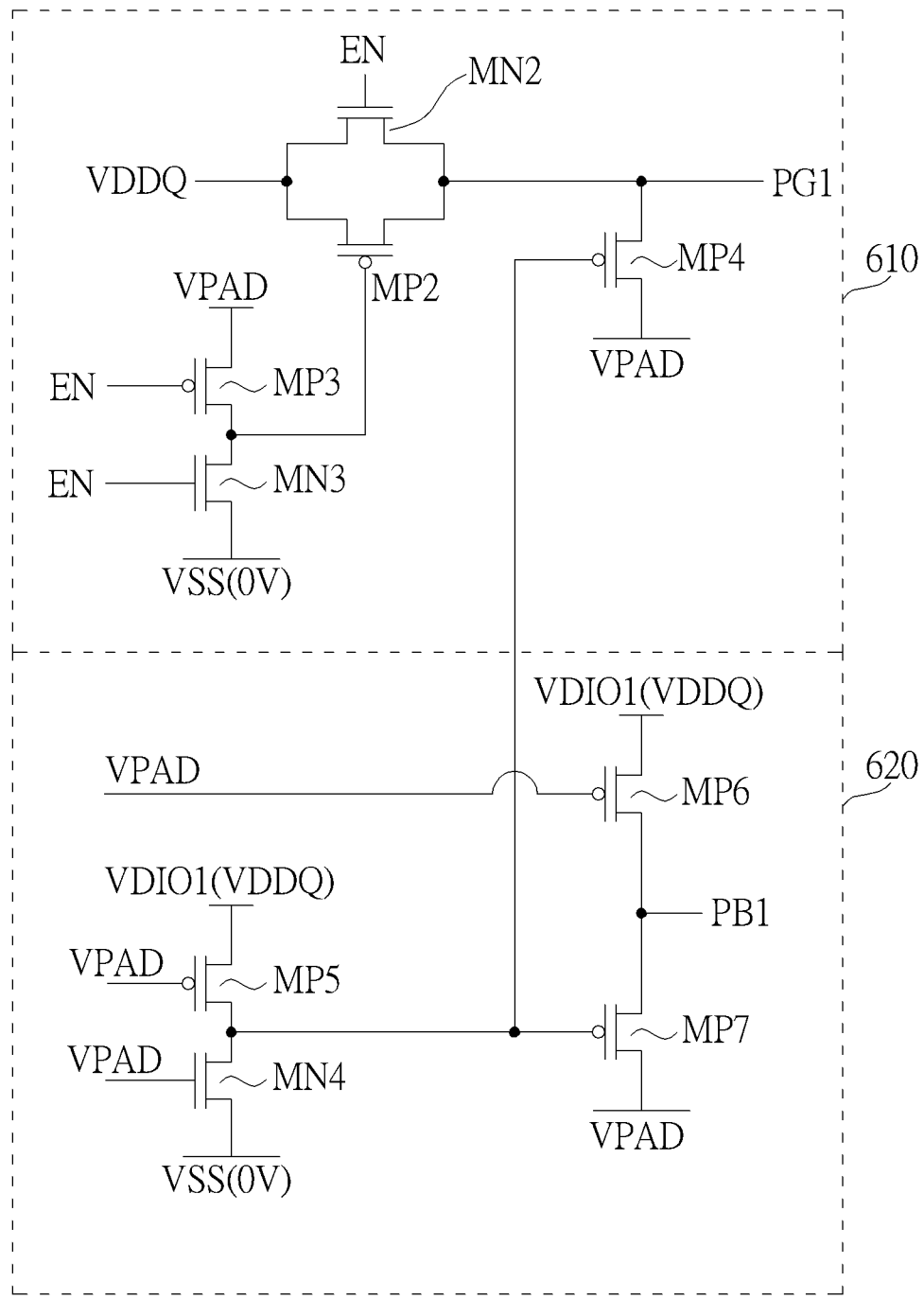
FIG. 7 is a diagram illustrating the first multiplexer and the second multiplexer when the output buffer operates in the input mode according to one embodiment of the present invention.

FIG. 7 is a diagram illustrating the first multiplexer 610 and the second multiplexer 620 when the output buffer 100 operates in the input mode according to one embodiment of the present invention. As shown in FIG. 7, the first multiplexer 610 comprises P-type transistors MP2-MP4 and N-type transistors MN2-MN3, wherein the transistors MP2 and MN2 serve as a transmission gate to selectively output VDDQ as the gate control signal PG1, the transistors MP3 and MN3 are coupled between VPAD and VSS, and the transistor MP4 is used to selectively outputs VPAD as the gate control signal PG1. In the first multiplexer 610, the transistors MN2, MP3 and MN3 are controlled by an enable signal EN that is equal to 0V, the transistor MP2 is controlled by an output signal of the transistors MP3 and MN3. In addition, the second multiplexer 620 comprises P-type transistors MP5-MP7 and an N-type transistor MN4, wherein the transistors MP5 and MN4 are coupled between the supply voltage VDIO1 and VSS, the transistors MP6 and MP7 are coupled between the supply voltage VDIO1 and VPAD. In the second multiplexer 620, the transistors MP5, MN4 and MP6 are controlled by the voltage VPAD, the transistor MP7 is controlled by the output signal of the transistors MP5 and MN4, the output signal of the transistors MP5 and MN4 are also used to control the transistor MP4 of the first multiplexer 610, and an output signal of the transistors MP6 and MP7 serves as the bulk control signal PB1.

In the operation of the first multiplexer 610 and the second multiplexer 620 shown in FIG. 7, the enable signal EN is equal to 0V, and when the voltage VPAD has a high voltage level such as VDDQ, the transistors MP2, MN2, MN3, MP5, MP6 are disabled while the transistors MP3, MP4, MN4 and MP7 are enabled, so that the gate control signal PG1 and the bulk control signal PB1 are equal to VPAD. In addition, when the voltage VPAD has a low voltage level such as 0V, the transistors MN2, MN3, MP4, MN4 and MP7 are disabled while the transistors MP2, MP3, MP5 and MP6 are enabled, so that the gate control signal PG1 and the bulk control signal PB1 are equal to VDDQ.

Figure 8:
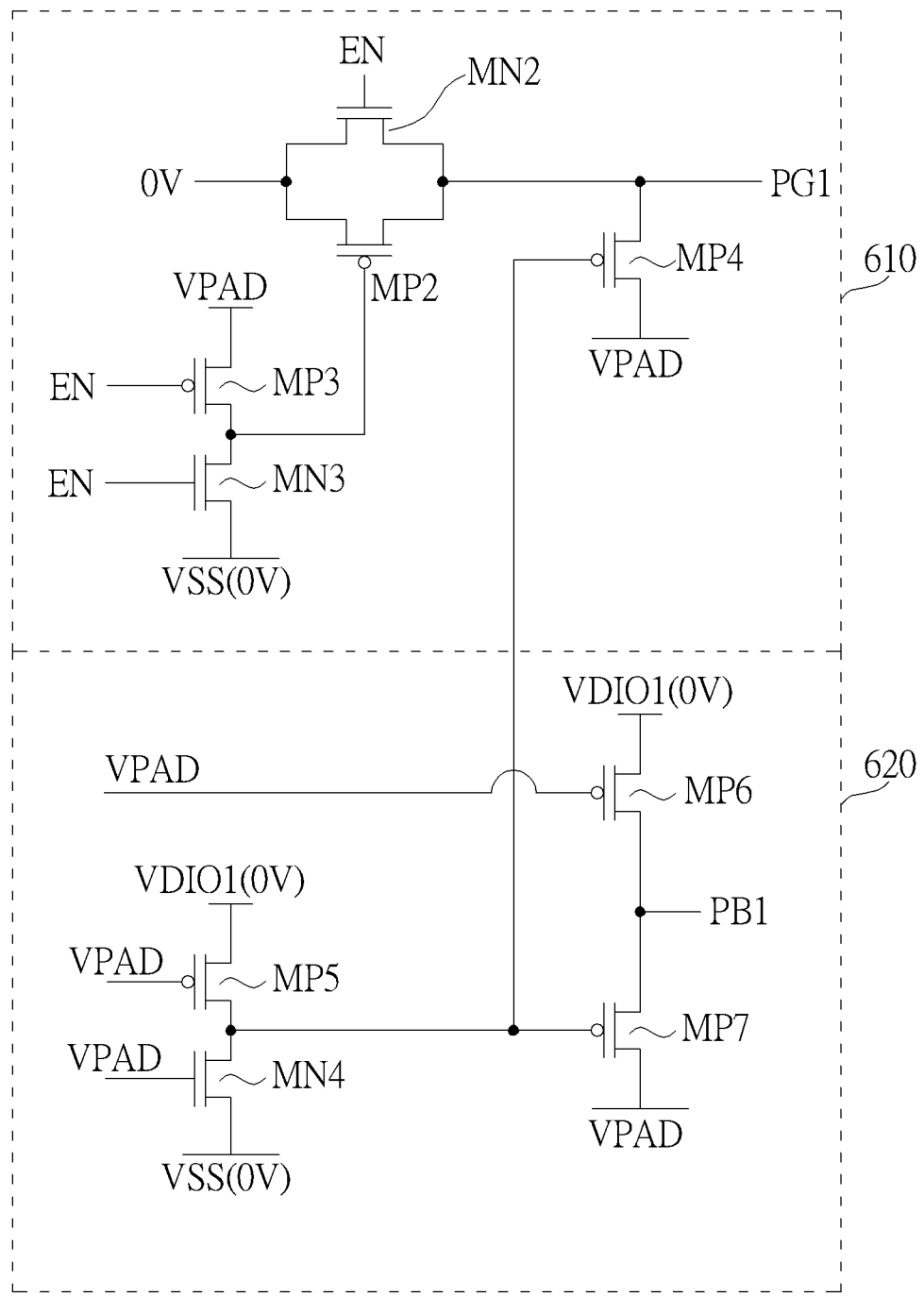
FIG. 8 is a diagram illustrating the first multiplexer and the second multiplexer when the output buffer operates in the fail-safe mode according to one embodiment of the present invention.

FIG. 8 is a diagram illustrating the first multiplexer 610 and the second multiplexer 620 when the output buffer 100 operates in the fail-safe mode according to one embodiment of the present invention. As shown in FIG. 8, regardless of whether the voltage VPAD has high voltage level or low voltage level, the gate control signal PG1 and the bulk control signal PB1 are equal to VPAD.

It is noted that the embodiment shown in FIGS. 6-8 are for illustration without a limitation of the present invention. In other embodiments, as long as the pad-tracking circuit 120 can always provide the voltage VPAD at the pad 104 as the gate control signal PG1 and the bulk control signal PB1 when the supply voltage VDIO1 ramps up and ramps down, the pad-tracking circuit 120 may have other circuit designs.

Figure 9:
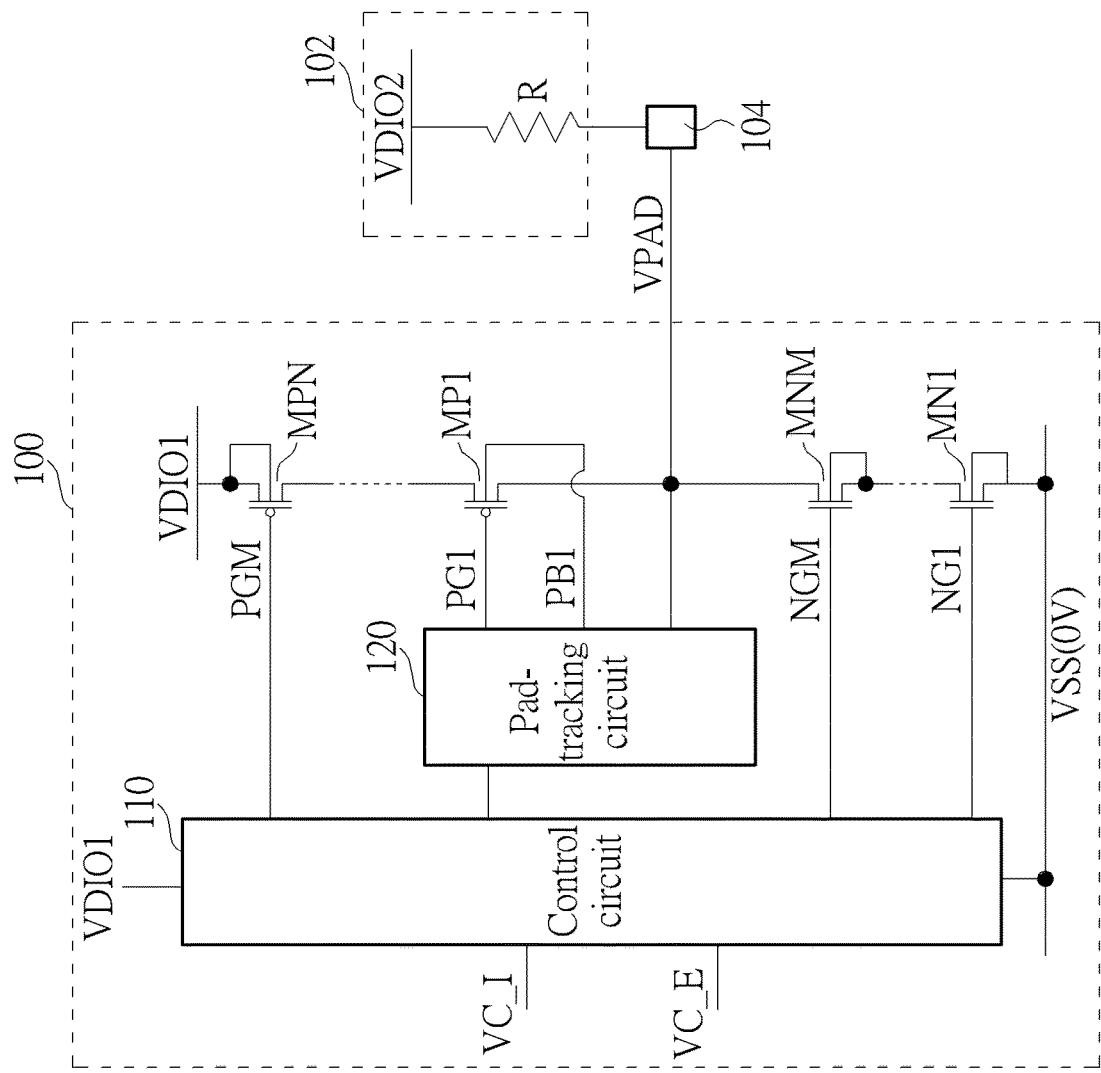
FIG. 9 is a diagram illustrating an output buffer according to another embodiment of the present invention.

In the above embodiment shown in FIG. 1-3, the output buffer 100 comprises only one P-type transistor MP1 and only one N-type transistor MN1 serving as an output stage, however, in other embodiment, the output stage may have more than one P-type transistor and/or more than one N-type transistor. Taking FIG. 9 as an example, the output stage comprises P-type transistors MP1-MPN and N-type transistors MN1-MNM connected in cascode, and the P-type transistors MP1-MPN and N-type transistors MN1-MNM are controlled by control signals PG1-PGM and NG1-NGM, respectively.

Briefly summarized, in the output buffer of the present invention, when the output buffer switches between the input mode and the fail-safe mode, the pad-tracking circuit always provides the gate control signal that is substantially equal to the voltage of the pad to control the P-type transistor when the supply voltage ramps up or ramps down. Therefore, there will be no leakage current flowing through the P-type transistor when the supply voltage of the P-type transistor ramps up or ramps down.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer, comprising:
   a first transistor, coupled between a supply voltage and an output node, wherein the output node is coupled to a pad;
   a second transistor, coupled between the output node and a reference voltage;
   a pad-tracking circuit, coupled to the first transistor, configured to generate a gate control signal to a gate electrode of the first transistor;
   wherein the output buffer is selectively operated in an input mode and a fail-safe mode, when the output buffer operates in the input mode, the pad-tracking circuit generates the gate control signal to disable the first transistor, and the second transistor is also disabled; and when the output buffer operates in the fail-safe mode, the first transistor is powered down, and the pad-tracking circuit generates the gate control signal to the gate electrode of the first transistor according to a voltage of the pad;
   wherein when the output buffer switches between the input mode and the fail-safe mode, and the supply voltage of the first transistor ramps up or ramps down, the pad-tracking circuit generates the gate control signal to the gate electrode of the first transistor according to the voltage of the pad;
   wherein when the output buffer operates in the input mode different from the fail-safe mode: the supply voltage has a fixed voltage level; and if the voltage of the pad has a high voltage level equal to the fixed voltage level of the supply voltage, the pad-tracking circuit refers to the voltage of the pad to generate the gate control signal, and a voltage level of the gate control signal is substantially equal to the voltage of the pad; and if the voltage of the pad has a low voltage level, the pad-tracking circuit refers to the supply voltage having the fixed voltage level to generate the gate control signal, and the voltage level of the gate control signal is substantially equal to the voltage of the supply voltage having the fixed voltage level.

2. The output buffer of claim 1, wherein the when the output buffer switches between the input mode and the fail-safe mode and the supply voltage of the first transistor ramps up or ramps down, the pad-tracking circuit always generates the gate control signal to the gate electrode of the first transistor according to the voltage of the pad, and a voltage level of the gate control signal is substantially equal to the voltage of the pad.

3. The output buffer of claim 1, wherein when the output buffer switches between the input mode and the fail-safe mode and the supply voltage of the first transistor ramps up or ramps down, the pad-tracking circuit generates a bulk control signal to a bulk of the first transistor according to the voltage of the pad.

4. The output buffer of claim 3, wherein when the output buffer switches between the input mode and the fail-safe mode and the supply voltage of the first transistor ramps up or ramps down, the pad-tracking circuit always generates the gate control signal and the bulk control signal to the gate electrode and the bulk of the first transistor according to the voltage of the pad, and a voltage level of the gate control signal and a voltage of the bulk control signal are substantially equal to the voltage of the pad.

5. An output buffer, comprising:
a first transistor, coupled between a supply voltage and an output node, wherein the output node is coupled to a pad;
a second transistor, coupled between the output node and a reference voltage;
a pad-tracking circuit, coupled to the first transistor, configured to generate a gate control signal to a gate electrode of the first transistor;
wherein the output buffer is selectively operated in an input mode and a fail-safe mode, when the output buffer operates in the input mode, the pad-tracking circuit generates the gate control signal to disable the first transistor, and the second transistor is also disabled; and when the output buffer operates in the fail-safe mode, the first transistor is powered down, and the pad-tracking circuit generates the gate control signal to the gate electrode of the first transistor according to a voltage of the pad;
wherein when the output buffer switches between the input mode and the fail-safe mode, and the supply voltage of the first transistor ramps up or ramps down, the pad-tracking circuit generates the gate control signal to the gate electrode of the first transistor according to the voltage of the pad;
wherein when the output buffer operates in the input mode different from the fail-safe mode: the supply voltage has a fixed voltage level; and if the voltage of the pad has a high voltage level equal to the fixed voltage level of the supply voltage, the pad-tracking circuit refers to the voltage of the pad to generate the gate control signal and a bulk control signal, and voltage levels of the gate control signal and the bulk control signal are substantially equal to the voltage of the pad; and if the voltage of the pad has a low voltage level, the pad-tracking circuit refers to the supply voltage having the fixed voltage level to generate the gate control signal and the bulk control signal, and the voltage levels of the gate control signal and the bulk control signal are substantially equal to the voltage of the supply voltage having the fixed voltage level.

6. The output buffer of claim 5, wherein the when the output buffer switches between the input mode and the fail-safe mode and the supply voltage of the first transistor ramps up or ramps down, the pad-tracking circuit always generates the gate control signal to the gate electrode of the first transistor according to the voltage of the pad, and a voltage level of the gate control signal is substantially equal to the voltage of the pad.

7. The output buffer of claim 5, wherein when the output buffer switches between the input mode and the fail-safe mode and the supply voltage of the first transistor ramps up or ramps down, the pad-tracking circuit generates a bulk control signal to a bulk of the first transistor according to the voltage of the pad.

8. An output buffer, comprising:
a first transistor, coupled between a supply voltage and an output node, wherein the output node is coupled to a pad;
a second transistor, coupled between the output node and a reference voltage;
a pad-tracking circuit, coupled to the first transistor, configured to generate a gate control signal to a gate electrode of the first transistor;
wherein the output buffer is selectively operated in an input mode and a fail-safe mode, when the output buffer operates in the input mode, the pad-tracking circuit generates the gate control signal to disable the first transistor, and the second transistor is also disabled; and when the output buffer operates in the fail-safe mode, the first transistor is powered down, and the pad-tracking circuit generates the gate control signal to the gate electrode of the first transistor according to a voltage of the pad;
wherein when the output buffer switches between the input mode and the fail-safe mode, and the supply voltage of the first transistor ramps up or ramps down, the pad-tracking circuit generates the gate control signal to the gate electrode of the first transistor according to the voltage of the pad;
wherein when the output buffer operates in the input mode, the supply voltage has a fixed voltage level; and the pad-tracking circuit refers to the voltage of the pad to determine if generating the gate control signal according to the voltage of the pad or generating the gate control signal according to the supply voltage having the fixed voltage level;
wherein the pad-tracking circuit comprises:
a first multiplexer, configured to receive a plurality of input signals, and select one of the plurality of input signals to serve as the gate control signal, wherein the plurality of input signals comprises a first input signal having the fixed voltage level and a second input signal having the voltage of the pad;
wherein when the output buffer operates in the input mode different from the fail-safe mode: the supply voltage has a fixed voltage level; and if the voltage of the pad has a high voltage level equal to the fixed voltage level of the supply voltage, the first multiplexer selects the second input signal as the gate control signal; and if the voltage of the pad has a low voltage level, the first multiplexer selects the first input signal as the gate control signal.

9. The output buffer of claim 8, wherein the pad-tracking circuit refers to the voltage of the pad to determine if generating a bulk control signal to a bulk of the first transistor according to the voltage of the pad or generating the bulk control signal according to the supply voltage having the fixed voltage level; and the pad-tracking circuit comprises:
a second multiplexer, configured to receive the plurality of input signals, and select one of the plurality of input signals to serve as the bulk control signal.

10. The output buffer of claim 8, wherein when the output buffer operates in the fail-safe mode: if the voltage of the pad has the high voltage level, the first multiplexer outputs the second input signal to serve as the gate control signal.

11. The output buffer of claim 9, wherein when the output buffer operates in the input mode: if the voltage of the pad has the high voltage level, the first multiplexer outputs the second input signal to serve as the gate control signal, and the second multiplexer outputs one of the plurality of input signals whose voltage level is equal to the second input signal to serve as the bulk control signal.

12. The output buffer of claim 9, wherein when the output buffer operates in the input mode: if the voltage of the pad has the low voltage level, the first multiplexer outputs the first input signal to serve as the gate control signal, and the second multiplexer outputs one of the plurality of input signals whose voltage level is equal to the first input signal to serve as the bulk control signal.

\* \* \* \* \*